United States Patent
Soer et al.

(10) Patent No.: US 9,726,989 B2
(45) Date of Patent: Aug. 8, 2017

(54) SPECTRAL PURITY FILTER

(75) Inventors: Wouter Anthon Soer, Nijmegen (NL); Vadim Yevgenyevich Banine, Deurne (NL); Erik Roelof Loopstra, Eindhoven (NL); Andrei Mikhailovich Yakunin, Eindhoven (NL); Martin Jacobus Johan Jak, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 1001 days.

(21) Appl. No.: 13/643,265

(22) PCT Filed: Feb. 22, 2011

(86) PCT No.: PCT/EP2011/052573
§ 371 (c)(1),
(2), (4) Date: Oct. 24, 2012

(87) PCT Pub. No.: WO2011/134692
PCT Pub. Date: Nov. 3, 2011

(65) Prior Publication Data
US 2013/0038926 A1 Feb. 14, 2013

Related U.S. Application Data

(60) Provisional application No. 61/328,426, filed on Apr. 27, 2010.

(51) Int. Cl.
*G02B 5/20* (2006.01)
*G03F 7/20* (2006.01)

(52) U.S. Cl.
CPC ......... *G03F 7/70891* (2013.01); *G02B 5/208* (2013.01); *G03F 7/70191* (2013.01); *G03F 7/70575* (2013.01)

(58) Field of Classification Search
CPC ......... G02B 5/20; G03F 1/36; G03F 7/70291; G03F 7/70108; G03F 7/70575
(Continued)

(56) References Cited

U.S. PATENT DOCUMENTS 5,973,316 A 10/1999 Ebbesen et al.
6,014,251 A * 1/2000 Rosenberg ............... G02B 5/20
343/909

(Continued)

FOREIGN PATENT DOCUMENTS

JP 2004-103773 4/2004
JP 2004-134743 4/2004
(Continued)

OTHER PUBLICATIONS

European Office Action dated Nov. 21, 2014 in corresponding European patent Application No. 11707372.6.
(Continued)

*Primary Examiner* — Audrey Y Chang
(74) *Attorney, Agent, or Firm* — Pillsbury Winthrop Shaw Pittman LLP

(57) ABSTRACT

A spectral purity filter includes a body of material, through which a plurality of apertures extend. The apertures are arranged to suppress radiation having a first wavelength and to allow at least a portion of radiation having a second wavelength to be transmitted through the apertures. The second wavelength of radiation is shorter than the first wavelength of radiation. The body of material is formed from a material having a bulk reflectance of substantially greater than or equal to 70% at the first wavelength of radiation. The material has a melting point above 1000° C.

2 Claims, 7 Drawing Sheets

(58) Field of Classification Search
USPC ........ 355/67, 53, 77, 71; 359/359, 360, 634, 359/619, 361; 430/5
See application file for complete search history.

(56) References Cited

U.S. PATENT DOCUMENTS

| | | | |
|---|---|---|---|
| 6,522,465 B1* | 2/2003 | Goldstein | G03F 7/70158 359/16 |
| 7,016,034 B2 | 3/2006 | Holz et al. | |
| 7,365,350 B2 | 4/2008 | Tran et al. | |
| 7,453,071 B2 | 11/2008 | Wassink | |
| 7,453,645 B2* | 11/2008 | Klunder | G03F 7/70575 359/619 |
| 7,639,418 B2 | 12/2009 | Banine et al. | |
| 8,536,551 B2 | 9/2013 | Moriya et al. | |
| 2006/0146413 A1 | 7/2006 | Klunder et al. | |
| 2009/0314967 A1 | 12/2009 | Moriya et al. | |
| 2011/0229804 A1* | 9/2011 | Yang | G03F 1/36 430/5 |

FOREIGN PATENT DOCUMENTS

| | | |
|---|---|---|
| JP | 2006-35424 | 2/2006 |
| JP | 2006-191090 | 7/2006 |
| JP | 2006-279036 | 10/2006 |
| JP | 2006-319328 | 11/2006 |
| JP | 2007-227532 | 9/2007 |
| JP | 2009-531854 | 9/2009 |
| JP | 2010-21543 | 1/2010 |
| JP | 2011-530184 | 12/2011 |
| JP | 2012-503868 | 2/2012 |
| WO | 02/079863 | 10/2002 |
| WO | 2010/015508 | 2/2010 |
| WO | 2010/017890 | 2/2010 |
| WO | 2010/022840 | 3/2010 |
| WO | 2010/034385 | 4/2010 |
| WO | 2011/000622 | 1/2011 |
| WO | 2011/023470 | 3/2011 |
| WO | 2011/032768 | 3/2011 |
| WO | 2011/035963 | 3/2011 |
| WO | 2011/098170 | 8/2011 |

OTHER PUBLICATIONS

Soer, W. A. et al., "Grid spectral purity filters for suppression of infrared radiation in laser-produced plasma EUV sources", Proceedings of the SPIE—The International Society for Optical Engineering SPIE—The International Society for Optical Engineering USA, vol. 7271, 2009.
International Search Report mailed Jul. 21, 2011 in corresponding International Patent Application No. PCT/EP2011/052573.
Simon G. Kaplan et al., "Silicon as a standard material for infrared reflectance and transmittance from 2 to 5 μm," Infrared Physics & Technology, vol. 43, No. 6, pp. 389-396 (2002).
European Office Action dated Aug. 20, 2015 in corresponding European patent Application No. 11707372.6.
Schumann, J. et al., "Polycrystalline Iridium Silicide Films. Phase Formation, Electrical and Optical Properties", Physica Status Solidi (A), vol. 145, No. 2, Oct. 16, 1994, pp. 429-439.
Amiotti, M. et al., "Optical Properties of Polycrystalline Nickel Silicides", Physical Review B (Condensed Matter), vol. 42, No. 14, Nov. 15, 1990, pp. 8939-8946.
Pimbley, J. M. et al., "Infrared Optical Constants of PtSi", Applied Physics Letters, vol. 42, No. 11, Jun. 1, 1983, pp. 984-986.
Korean Office Action dated Jan. 19, 2017 in corresponding Korean Patent Application No. 10-2012-7030943.

* cited by examiner

SPECTRAL PURITY FILTER

CROSS-REFERENCE TO RELATED APPLICATIONS

This application is the national phase entry of PCT/EP2011/052573, filed Feb. 22, 2011, which claims the benefit of U.S. provisional application 61/328,426, which was filed on Apr. 27, 2010, and which is incorporated herein in its entirety by reference.

FIELD

The present invention relates to a spectral purity filter, and for example a spectral purity filter suitable for use in a lithographic apparatus and/or a lithographic method.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing (i.e. pattern application) can be given by the Rayleigh criterion for resolution as shown in equation (1):

$$CD = k_1 * \frac{\lambda}{NA} \quad (1)$$

where $\lambda$ is the wavelength of the radiation used, NA is the numerical aperture of the projection system used to print (i.e. apply) the pattern, $k_1$ is a process dependent adjustment factor, also called the Rayleigh constant, and CD is the feature size (or critical dimension) of the printed (i.e. applied) feature. It follows from equation (1) that reduction of the minimum printable (i.e. applicable) size of features can be obtained in three ways: by shortening the exposure wavelength $\lambda$, by increasing the numerical aperture NA or by decreasing the value of $k_1$.

In order to shorten the exposure wavelength and, thus, reduce the minimum printable (i.e. applicable) feature size, it has been proposed to use an extreme ultraviolet (EUV) radiation source. EUV radiation is electromagnetic radiation having a wavelength within the range of 5-20 nm, for example within the range of 13-14 nm, or example within the range of 5-10 nm such as 6.7 nm or 6.8 nm. Possible sources include, for example, laser-produced plasma (LPP) sources, discharge plasma (DPP) sources, or sources based on synchrotron radiation provided by an electron storage ring.

EUV radiation may be produced using a plasma. A radiation system for producing EUV radiation may include a laser for exciting a fuel to provide the plasma, and a source collector module for containing the plasma. The plasma may be created, for example, by directing a laser beam at a fuel, such as particles of a suitable material (e.g. tin), or a stream of a suitable gas or vapor, such as Xe gas or Li vapor. The resulting plasma emits output radiation, e.g., EUV radiation, which is collected using a radiation collector. The radiation collector may be a mirrored normal incidence radiation collector, which receives the radiation and focuses the radiation into a beam. The source collector module may include an enclosing structure or chamber arranged to provide a vacuum environment to support the plasma. Such a radiation system is typically termed a laser produced plasma (LPP) source.

Practical EUV Sources, such those which generate EUV radiation using a plasma, do not only emit desired 'in-band' EUV radiation, but also undesirable 'out-of-band' radiation. This out-of-band radiation is most notably in the deep ultra violet (DUV) radiation range (100-400 nm). Moreover, in the case of some EUV sources, for example laser produced plasma EUV sources, the radiation from the laser, usually at 10.6 μm, presents a significant amount of out-of-band radiation.

SUMMARY

In a lithographic apparatus, spectral purity is desirable for several reasons. One reason is that resist is sensitive to out-of-band wavelengths of radiation, and thus the image quality of patterns applied to the resist may be deteriorated if the resist is exposed to such out-of-band radiation. Furthermore, out-of-band radiation infrared radiation, for example the 10.6 μm radiation in some laser produced plasma sources, may lead to unwanted and unnecessary heating of the patterning device, substrate and optics within the lithographic apparatus. Such heating may lead to damage of these elements, degradation in their lifetime, and/or defects or distortions in patterns projected onto and applied to a resist-coated substrate.

In order to overcome these challenges, several different transmissive spectral purity filters have been proposed which substantially prevent the transmission of infrared radiation, while simultaneously allowing the transmission of EUV radiation. Some of these proposed spectral purity filters comprise of a structure which is substantially opaque to, for example, infrared radiation, while at the same time being substantially transparent to EUV radiation. These and other spectral purity filters may also be provided with one or more apertures. The size and spacing of the apertures may be chosen such that infrared radiation is diffracted by the apertures (and thereby suppressed), while EUV radiation is transmitted through the apertures. A spectral purity filter provided with apertures may have a higher EUV transmittance than a spectral purity filter which is not provided with apertures. This is because EUV radiation will be able to pass through an aperture more easily than it would through a given thickness of solid material.

A typical spectral purity filter may be formed, for example, from a silicon foundation structure (e.g. a silicon grid, or other member, provided with apertures) that is coated with a reflective metal, such as molybdenum. In use, a typical spectral purity filter might be subjected to a high heat load from, for example, incident infrared and EUV radiation. The heat load might result in the temperature of the spectral purity filter being above 800° C. A typical spectral purity filter comprising of silicon coated with molybdenum has been found to have an unsatisfactorily short lifetime above 800° C. This is due to a reaction between the reflective molybdenum coating and the underlying silicon support structure, which results in eventual delamination of the coating. Delamination and degradation of the silicon foundation structure is accelerated by the presence of hydrogen, which is often used as a gas in the environment in which the spectral purity filter is used in order to suppress debris (e.g. debris, such as particles or the like), from entering or leaving certain parts of the lithographic apparatus.

In a lithographic apparatus (and/or method) it is desirable to minimize the losses in intensity of radiation which is being used to apply a pattern to a resist coated substrate. One reason for this is that, ideally, as much radiation as possible should be available for applying a pattern to a substrate, for instance to reduce the exposure time and increase throughput. At the same time, it is desirable to minimize the amount of undesirable (e.g. out-of-band) radiation that is passing through the lithographic apparatus and which is incident upon the substrate. Furthermore, it is desirable to ensure that a spectral purity filter used in a lithographic method or apparatus has an adequate lifetime, and does not degrade rapidly over time as a consequence of the high heat load to which the spectral purity filter may be exposed, and/or the hydrogen (or the like) to which the spectral purity filter may be exposed. It is therefore desirable to provide an improved (or alternative) spectral purity filter, and for example a spectral purity filter suitable for use in a lithographic apparatus and/or method.

According to an aspect of the present invention, there is provided a spectral purity filter, comprising: a body of material, through which a plurality of apertures extend; the apertures being arranged to suppress radiation having a first wavelength and to allow at least a portion of radiation having a second wavelength to be transmitted through the apertures, the second wavelength of radiation being shorter than the first wavelength of radiation; the body of material being formed from a material having a bulk reflectance of substantially greater than or equal to 70% at the first wavelength of radiation, the material also having a melting point above 1000° C.

The material may comprise one or more of: Cr, Fe, Ir, Mo, Nb, Ni, Os, Pt, Re, Rh, Ru, Ta, and W, or a silicide thereof.

The material may comprise of an alloy of one or more of: Cr, Fe, Ir, Mo, Nb, Ni, Os, Pt, Re, Rh, Ru, Ta, and W, or a silicide thereof. The alloy may comprise of a majority amount by atomic weight of one or more of, or a combination of one or more of: Cr, Fe, Ir, Mo, Nb, Ni, Os, Pt, Re, Rh, Ru, Ta, and W, or a silicide thereof.

The material may further comprise a plurality of nanoparticles for increasing a re-crystallization temperature of the material as a whole. The nanoparticles may be distributed in layers within the body of material. The nanoparticles may comprise of one or more of: $Al_2O_3$, $HfO_2$, $ZrO_2$, $Y_2O_3$, MgO, La2O3, $Ce_2O_3$, SrO, and HfC.

A face of the body of material through which the apertures extend comprises of, or is provided with, a region or layer that is formed from substantially pure Cr, Fe, Ir, Mo, Nb, Ni, Os, Pt, Re, Rh, Ru, Ta, and W, or a silicide thereof. The face, in use, is configured to face toward incident radiation comprising the first wavelength and/or the second wavelength.

The first wavelength of radiation may have a wavelength that is in the infrared region of the electromagnetic spectrum, and/or the first wavelength is in the range of 9-12 µm, for example about 9.4 µm or about 10.6 µm.

The second wavelength of radiation may have a wavelength that is substantially equal to or shorter than radiation having a wavelength in the EUV part of the electromagnetic spectrum, and/or the second wavelength is in the range of 5-20 nm, for example 13-14 nm or 6-7 nm, for instance 6.6-6.9 nm According to an aspect of the present invention, there is provided a method of manufacturing a spectral purity filter, comprising: using a lithography and etch process on a body of material provided on a substrate, to provide a plurality of apertures in that body of material, the apertures being arranged to, in use, suppress radiation having a first wavelength and to, in use, allow at least a portion of radiation having a second wavelength to be transmitted through the apertures, the second wavelength of radiation being shorter than the first wavelength of radiation; releasing the body of material from the substrate, the body of material forming the spectral purity filter, wherein the body of material is from a material having a bulk reflectance of substantially greater than or equal to 70% at the first wavelength of radiation, the material also having a melting point above 1000° C.

According to an aspect of the present invention, there is provided a method of manufacturing a spectral purity filter, comprising: forming a mold for reception of a body of material, the mold being shaped to provide a plurality of apertures in that body of material, the apertures being arranged to, in use, suppress radiation having a first wavelength and to, in use, allow at least a portion of radiation having a second wavelength to be transmitted through the apertures, the second wavelength of radiation being shorter than the first wavelength of radiation; supplying the mold with the body of material, removing the mold to leave the body of material, which forms the spectral purity filter, wherein the body of material is from a material having a bulk reflectance of substantially greater than or equal to 70% at the first wavelength of radiation, the material also having a melting point above 1000° C.

In relation to method or apparatus aspects of the invention, the body of material may be divided into a plurality of relatively thick layers by a plurality of relatively thin layers of a second material. The layers of the second material may comprise: B, C, Si, or an oxide, nitride or carbide of a constituent of the body of material; and/or nanoparticles, comprising of one or more of: $Al_2O_3$, $HfO_2$, $ZrO_2$, $Y_2O_3$, MgO, La2O3, $Ce_2O_3$, SrO, and HfC.

The body of material may be provided (e.g. deposited) in a manner which is interrupted periodically by an etch (e.g. a sputter etch) of the surface of the body of material Other aspects might relate to a spectral purity filter manufactured using the methods of aspects of the invention.

According to an aspect of the present invention, there is provided a spectral purity filter, comprising: a body of material, through which a plurality of apertures extend; the apertures being arranged to suppress radiation having a first wavelength and to allow at least a portion of radiation having a second wavelength to be transmitted through the apertures, the second wavelength of radiation being shorter than the first wavelength of radiation; the body of material being formed from: a molybdenum-rhenium alloy, or a tungsten-rhenium alloy; or a tungsten-molybdenum alloy; or a tungsten-molybdenum-rhenium alloy.

The content of rhenium in the alloy, in atomic percentage, may be: 0.1% to 49% for the molybdenum-rhenium alloy;

0.1% to 27% for the tungsten-rhenium alloy; 0.1% to 49% for the tungsten-molybdenum-rhenium alloy.

The body of material may further comprise a plurality of nanoparticles for increasing a re-crystallization temperature of the body of material as a whole. The nanoparticles may comprise of one or more of: $Al_2O_3$, $HfO_2$, $ZrO_2$, $Y_2O_3$, MgO, $La_2O_3$, $Ce_2O_3$, SrO, and HfC. The nanoparticles may be distributed in layers within the body of material.

A face of the body of material through which the apertures extend may comprise of, or may be provided with, a region or layer that is formed from substantially pure molybdenum or tungsten. The face may, in use, be configured to face toward incident radiation comprising the first wavelength and/or the second wavelength.

The first wavelength of radiation may have a wavelength that is in the infrared region of the electromagnetic spectrum, and/or the first wavelength is in the range of 9-12 µm, for example about 9.4 µm or about 10.6 µm.

The second wavelength of radiation may have a wavelength that is substantially equal to or shorter than radiation having a wavelength in the EUV part of the electromagnetic spectrum, and/or the second wavelength is in the range of 5-20 nm, for example 13-14 nm or 6-7 nm, for instance about 6.6 nm to a about 6.9 nm.

According to an aspect of the present invention, there is provided a spectral purity filter, comprising: a body of material, through which a plurality of apertures extend; the apertures being arranged to suppress radiation having a first wavelength and to allow at least a portion of radiation having a second wavelength to be transmitted through the apertures, the second wavelength of radiation being shorter than the first wavelength of radiation; the body of material being formed from molybdenum, or from tungsten, and the body of material further comprising a plurality of nanoparticles for increasing a re-crystallization temperature of the body of material as a whole.

The nanoparticles may comprise of one or more of: $Al_2O_3$, $HfO_2$, $ZrO_2$, $Y_2O_3$, MgO, $La_2O_3$, $Ce_2O_3$, SrO, and HfC.

The nanoparticles may be distributed in layers within the body of material.

The molybdenum may form part of a molybdenum-rhenium alloy; or a tungsten-molybdenum alloy; or a tungsten-molybdenum-rhenium alloy, or the tungsten may form part of a tungsten-rhenium alloy; or a tungsten-molybdenum alloy; or a tungsten-molybdenum-rhenium alloy. The content of rhenium in the respective alloy, in atomic percentage, may be: 0.1% to 49% for the molybdenum-rhenium alloy; 0.1% to 27% for the tungsten-rhenium alloy; 0.1% to 49% for the tungsten-molybdenum-rhenium alloy.

A face of the body of material through which the apertures extend may comprise of, or may be provided with, a region or layer that is formed from substantially pure molybdenum or tungsten. The face may, in use, be configured to face toward incident radiation comprising the first wavelength and/or the second wavelength.

The first wavelength of radiation may have a wavelength that is in the infrared region of the electromagnetic spectrum, and/or the first wavelength is in the range of 9-12 µm, for example about 9.4 µm or about 10.6 µm.

The second wavelength of radiation may have a wavelength that is substantially equal to or shorter than radiation having a wavelength in the EUV part of the electromagnetic spectrum, and/or the second wavelength is in the range of 5-20 nm, for example 13-14 nm or 6-7 nm, for instance 6.6-6.9 nm.

According to an aspect of the invention, there is provided a spectral purity filter assembly, comprising: a spectral purity filter comprising a body of material, through which a plurality of apertures extend, the apertures being arranged to suppress radiation having a first wavelength and to allow at least a portion of radiation having a second wavelength to be transmitted through the apertures, the second wavelength of radiation being shorter than the first wavelength of radiation; and an arrangement for, in use, increasing a temperature of at least a part of the spectral purity filter, the arrangement being separate from a source of the first and second wavelengths of radiation.

The arrangement may be configured to provide heat to the at least a part of the spectral purity filter in order to increase the temperature, and/or wherein the arrangement may be arranged to at least partially thermally insulate the spectral purity filter to, in use, increase the temperature.

The arrangement may comprise one or more mounts for mounting the spectral purity filter and for at least partially thermally insulating the spectral purity filter.

The arrangement may comprise a heat source.

The heat source may be one or more of: one or more electrical heaters or conductors in contact with or forming a part of the spectral purity filter; and/or a radiation source arranged to direct radiation at the spectral purity filter, the radiation having a wavelength that is substantially absorbed by the spectral purity filter.

The spectral purity filter may comprise: a face that, in use, is configured to face toward incident radiation comprising the first wavelength and/or the second wavelength; and a backside, located on an opposite side of the spectral purity filter to the face, and wherein the heat source is configured to provide heat to the backside of the spectral purity filter.

The face of the spectral purity filter may be substantially reflective with respect to the first wavelength of radiation, and wherein the backside is substantially absorbent with respect to the first wavelength of radiation.

According to an aspect of the invention, there is provided a method for increasing the temperature, in use, of a spectral purity filter, the method comprising: heating at least a part of the spectral purity filter using a heat source that is separate from a source of radiation that the spectral purity filter is designed to filter; and/or at least partially thermally isolating the spectral purity filter.

In general, according to any aspect of the present invention, the first wavelength of radiation may have a wavelength that is in the infrared region of the electromagnetic spectrum, and/or the first wavelength is in the range of 9-12 µm, for example about 9.4 µm or about 10.6 µm. The second wavelength of radiation may have a wavelength that is substantially equal to or shorter than radiation having a wavelength in the EUV part of the electromagnetic spectrum, and/or the second wavelength is in the range of 5-20 nm, for example 13-14 nm or 6-7 nm, for instance about 6.6 nm to a about 6.9 nm.

According to an aspect of the present invention, there is provided a lithographic apparatus, or a radiation source, having the spectral purity filter of any aspect of the invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
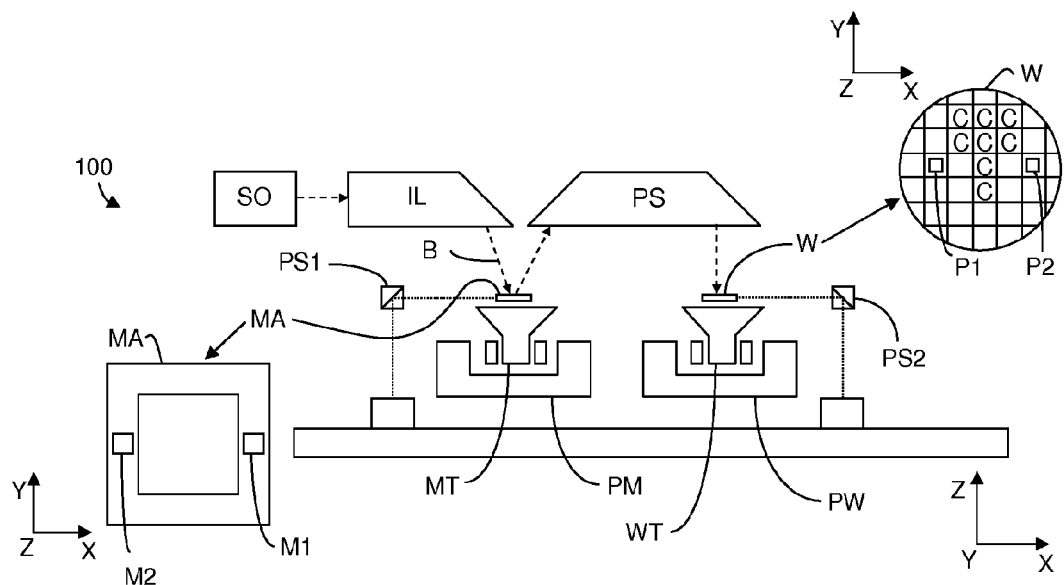
FIG. 1 schematically depicts a lithographic apparatus according to an embodiment of the invention.

FIG. 1 schematically depicts a lithographic apparatus 100 including a source collector module SO according to one embodiment of the invention. The apparatus comprises an illumination system (sometimes referred to as an illuminator) IL configured to condition a radiation beam B (e.g. EUV radiation); a support structure (e.g. a mask table) MT constructed to support a patterning device (e.g. a mask or a reticle) MA and connected to a first positioner PM configured to accurately position the patterning device MA; a substrate table (e.g. a wafer table) WT constructed to hold a substrate (e.g. a resist-coated wafer) W and connected to a second positioner PW configured to accurately position the substrate W; and a projection system (e.g. a reflective projection system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device MA, the design of the lithographic apparatus 100, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since other gases may absorb too much radiation. A vacuum environment may therefore be provided to the whole beam path with the aid of a vacuum wall and vacuum pumps.

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illumination system IL receives an extreme ultra violet (EUV) radiation beam from the source collector module SO. Methods to produce EUV light include, but are not necessarily limited to, converting a material into a plasma state that has at least one element, e.g., xenon, lithium or tin, with one or more emission lines in the EUV range. In one such method, often termed laser produced plasma (LPP), the plasma can be produced by irradiating a fuel, such as a droplet, stream or cluster of material having the desired line-emitting element, with a laser beam. The source collector module SO may be part of an EUV radiation system including a laser, not shown in FIG. 1, for providing the laser beam exciting the fuel. The resulting plasma emits output radiation, e.g. EUV radiation, which is collected using a radiation collector, disposed in the source collector module. The laser and the source collector module may be separate entities, for example when a $CO_2$ laser is used to provide the laser beam for fuel excitation.

In such cases, the laser is not considered to form part of the lithographic apparatus and the radiation beam is passed from the laser to the source collector module with the aid of a beam delivery system comprising, for example, suitable directing mirrors and/or a beam expander. In other cases the source may be an integral part of the source collector module, for example when the source is a discharge produced plasma EUV generator, often termed as a DPP source.

The illumination system IL may comprise an adjuster for adjusting the angular intensity distribution of the radiation beam B. Generally, at least the outer and/or inner radial extent (commonly referred to as σ-outer and σ-inner, respectively) of the intensity distribution in a pupil plane of the illumination system IL can be adjusted. In addition, the illumination system IL may comprise various other components, such as facetted field and pupil mirror devices. The illumination system may be used to condition the radiation beam, to have a desired uniformity and intensity distribution in its cross-section.

The radiation beam B is incident on the patterning device (e.g. mask) MA, which is held on the support structure (e.g. mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor PS2 (e.g. an interferometric device, linear encoder or capacitive sensor), the substrate table WT can be moved accurately, e.g. so as to position different target portions C in the path of the radiation beam B. Similarly, the first positioner PM and another position sensor PS1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously (e.g. in the X or Y direction) while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
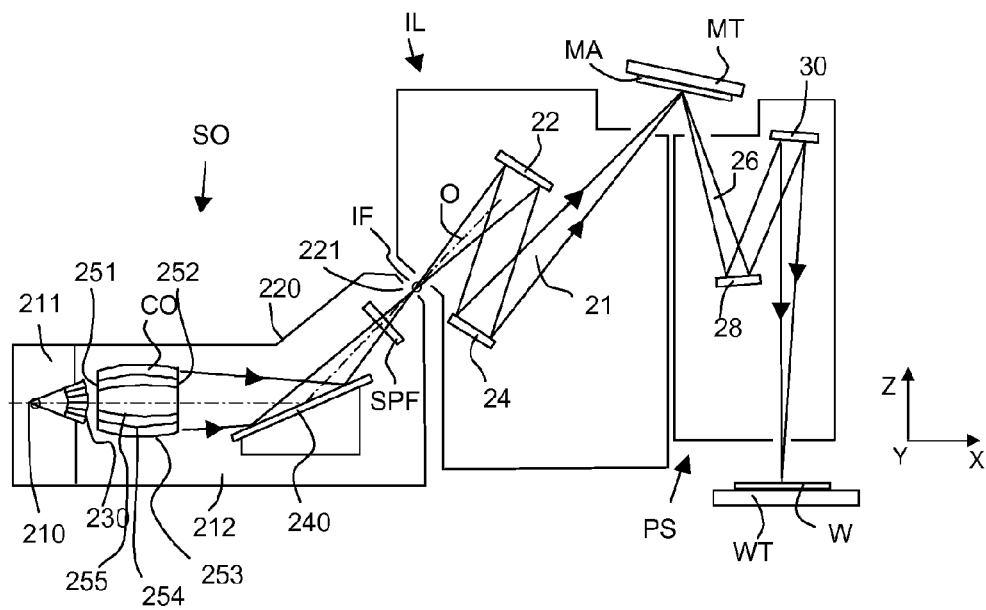
FIG. 2 is a more detailed view of the lithographic apparatus shown in FIG. 1, including a discharge produced plasma (DPP) source collector module.

FIG. 2 shows the apparatus 100 in more detail, including the source collector module SO, the illumination system IL, and the projection system PS. The source collector module SO is constructed and arranged such that a vacuum environment can be maintained in an enclosing structure 220 of the source collector module SO. An EUV radiation emitting plasma 210 may be formed by a discharge produced plasma (DPP) source. EUV radiation may be produced by a gas or vapor, for example Xe gas, Li vapor or Sn vapor in which the (very hot) plasma 210 is created to emit radiation in the EUV range of the electromagnetic spectrum. The (very hot) plasma 210 is created by, for example, an electrical discharge creating an at least partially ionized plasma. Partial pressures of, for example, 10 Pa of Xe, Li, Sn vapor or any other suitable gas or vapor may be used for efficient generation of the radiation. In an embodiment, a plasma of excited tin (Sn) is provided to produce EUV radiation.

The radiation emitted by the plasma 210 is passed from a source chamber 211 into a collector chamber 212 via an optional gas barrier or contaminant trap 230 (in some cases also referred to as contaminant barrier or foil trap) which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure, as known in the art.

The collector chamber 212 may include a radiation collector CO which may be a so-called grazing incidence collector. Radiation collector CO has an upstream radiation collector side 251 and a downstream radiation collector side 252. Radiation that traverses collector CO can be reflected off a grating spectral filter 240 to be focused in a virtual source point IF. The virtual source point IF is commonly referred to as the intermediate focus, and the source collector module SO is arranged such that the intermediate focus IF is located at or near an opening 221 in the enclosing structure 220. The virtual source point IF is an image of the radiation emitting plasma 210. Before passing through the opening 221, the radiation may pass through an optional spectral purity filter SPF. In other embodiments, the spectral purity filter SPF may be located in a different part of the lithographic apparatus (e.g. outside of the source collector module SO). Embodiments of a spectral purity filter are described in more detail below.

Subsequently the radiation traverses the illumination system IL, which may include a facetted field mirror device 22 and a facetted pupil mirror device 24 arranged to provide a desired angular distribution of the radiation beam 21, at the patterning device MA, as well as a desired uniformity of radiation intensity at the patterning device MA. Upon reflection of the beam of radiation 21 at the patterning device MA, held by the support structure MT, a patterned beam 26 is formed and the patterned beam 26 is imaged by the projection system PS via reflective elements 28, 30 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more reflective elements (e.g. mirrors or the like) present than those shown in the Figures, for example there may be 1-6 additional reflective elements present in the projection system PS than shown in FIG. 2.

Collector CO, as illustrated in FIG. 2, is depicted as a nested collector with grazing incidence reflectors 253, 254 and 255, just as an example of a collector (or collector mirror). The grazing incidence reflectors 253, 254 and 255 are disposed axially symmetric around an optical axis O and a collector CO of this type is desirably used in combination with a discharge produced plasma source, often called a DPP source.

Figure 3:
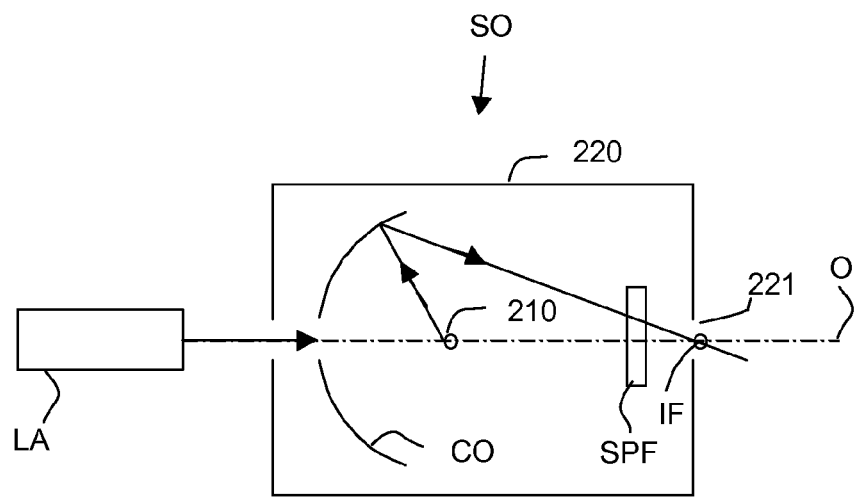
FIG. 3 is a view of an embodiment of a laser produced plasma (LPP) source collector module of the apparatus of FIG. 1.

Alternatively, the source collector module SO may be part of, comprise or form an LPP radiation system as shown in FIG. 3. Referring to FIG. 3, a laser LA is arranged to deposit laser energy into a fuel, such as a droplet or region or vapor of xenon (Xe), tin (Sn) or lithium (Li), creating the highly ionized plasma 210 with electron temperatures of several 10's of eV. The energetic radiation generated during de-excitation and recombination of these ions is emitted from the plasma 210, collected by a near normal incidence collector CO and focused onto the opening 221 in the enclosing structure 220. Before passing through the opening 221, the radiation may pass through an optional spectral purity filter SPF. In other embodiments, the spectral purity filter SPF may be located in a different part of the lithographic apparatus (e.g. outside of the source collector module SO). Embodiments of a spectral purity filter are described in more detail below.

It is known to use a spectral purity filter in a lithographic apparatus to filter out undesirable (e.g. out-of-band) wavelength components of a radiation beam. For instance, it is known to provide a spectral purity filter comprising one or more apertures. The diameter of, and/or spacing between the apertures is chosen such that the apertures suppress one or more undesirable wavelengths of radiation (i.e. radiation having a first wavelength, such as infrared radiation) by diffraction or scattering or the like, while allowing one or more desirable wavelengths of radiation (i.e. radiation having a second wavelength, such as EUV radiation) to pass through the apertures. For instance, the undesirable radiation may comprise infrared radiation which might heat and possible damage or deform the spectral purity filter, whereas the desirable radiation may comprise EUV or beyond EUV radiation that may be used to apply patterns to a resist coated substrate.

Figure 4:
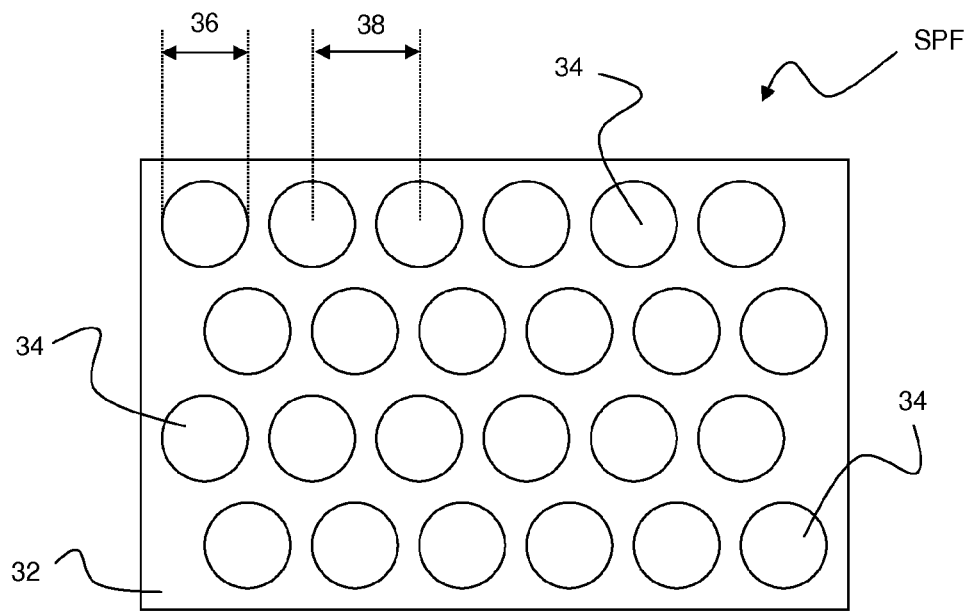
FIG. 4 schematically depicts a transmissive spectral purity filter.

FIG. 4 schematically depicts a spectral purity filter SPF. The spectral purity filter SPF comprises of a body of material in the form of a planar member 32 (discussed in more detail below) in which a periodic array of circular apertures 34 is provided. The diameter 36 of the apertures 34, and/or a spacing 38 between the apertures 34, is selected such that a first wavelength of radiation to be suppressed is substantially diffracted at the entrance of, and/or within, each aperture 34, while radiation of a second, shorter wavelength is transmitted through the apertures 34. The diameter 36 of the apertures 34 may be, for example, in the range of 1-100 µm, in order to suppress by diffraction radiation having a comparable wavelength (e.g. infrared radiation), while allowing radiation of a shorter wavelength (e.g. EUV radiation) to pass through the apertures 34.

The planar member 32 may be substantially opaque to the first wavelength of radiation or range of wavelengths which the spectral purity filter SPF is designed to suppress. For instance, the planar member 32 may reflect or absorb the first wavelength, for example a wavelength in the infrared range of the electromagnetic spectrum. The planar member 32 may also be substantially opaque to one or more second wavelengths of radiation which the spectral purity filter SPF is designed to transmit, for example a wavelength in the EUV range of the electromagnetic spectrum. However, the spectral purity filter SPF can also be formed from a planar member 32 which is substantially transparent to the one or more first wavelengths that the spectral purity filter SPF is designed to transmit. This may increase the transmittance of the spectral purity filter SPF with respect to the one or more wavelengths which the spectral purity filter SPF is designed to transmit.

The apertures 34 in the spectral purity filter SPF are arranged in a hexagonal pattern. This arrangement is desired, since it gives the closest packing of circular apertures, and therefore the highest transmittance for the spectral purity filter SPF. However, other arrangements of the apertures are also possible, for example square, and rectangular or other periodic or aperiodic arrangements may be used. For instance, in the case of a periodic array, a random pattern may be employed. The apertures (in whatever arrangement) may be circular in shape, or, for example, elliptical, hexagonal, square, rectangular, or any other suitable shape.

Figure 5:
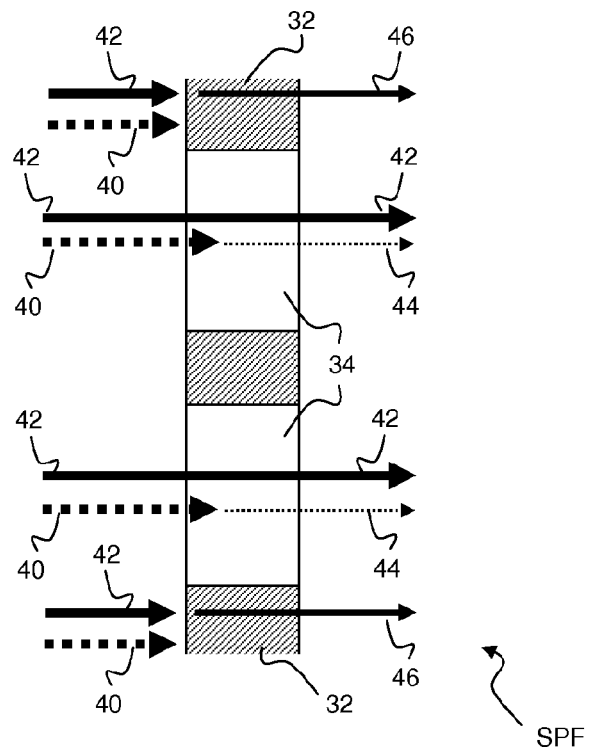
FIG. 5 schematically depicts a side-on and part-section view of the spectral purity filter of FIG. 4, together with radiation incident on the spectral purity filter.

FIG. 5 schematically depicts the spectral purity filter SPF of FIG. 4 in a side-on and part-section view. FIG. 5 further depicts radiation having a first wavelength 40 (e.g. infrared radiation) and radiation having a second, shorter, wavelength 42 (e.g. EUV radiation). The radiation 40, 42 constitutes radiation from a beam of radiation (e.g. the beam of radiation discussed above in relation to FIGS. 1 to 3). Radiation having a first wavelength 40 and radiation having a second wavelength 42 is incident upon the spectral purity filter SPF.

When radiation having a first wavelength 40 and radiation having a second wavelength 42 is directed toward an aperture 34 of the spectral purity filter SPF, the radiation having the first wavelength 40 is diffracted by the apertures 34 and is substantially suppressed from being transmitted through the spectral purity filter SPF. Only a small percentage of radiation having a first wavelength 40 is transmitted 44 through the apertures 34. Radiation having a second wavelength 42 readily passes through the apertures 34 of the spectral purity filter SPF. This is because the radiation having a second wavelength 42 is not substantially diffracted and suppressed by the apertures 34.

When radiation having a first wavelength 40 and radiation having a second wavelength 42 is directed toward a solid part of the planar member 32 forming the spectral purity filter SPF, the radiation having the first wavelength 40 is reflected or absorbed by the solid part of the planar member 32, and is thereby suppressed from being transmitted through the spectral purity filter SPF. This is because the planar member 32 is not transmissive with respect to the radiation having the first wavelength 40. Radiation having a second wavelength 42 is substantially transmitted 46 through the solid part of the planar member 32 of the spectral purity filter SPF. This is because the planar member 32 is substantially transmissive with respect to the radiation having the first wavelength 40.

FIG. 5 shows that only a small amount of radiation having the first wavelength 40 is able to pass through 44 the spectral purity filter SPF, whereas in contrast a much larger portion of radiation having the second wavelength 42 is able to pass through 42, 46 the spectral purity filter.

Figure 6:
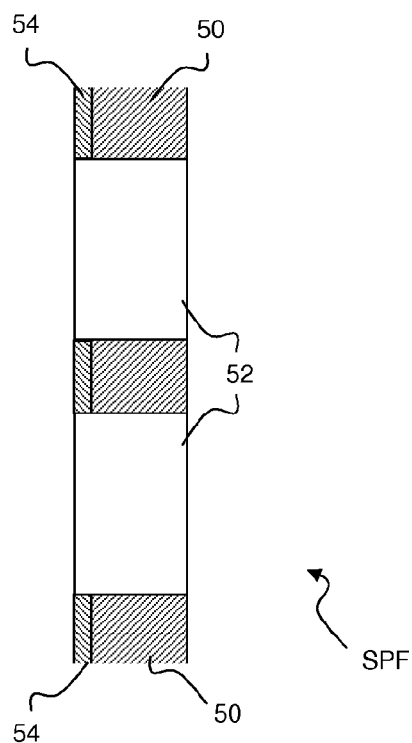
FIG. 6 schematically depicts a more detailed or alternative side-on and part-section view of the spectral purity filter of FIGS. 4 and 5.

FIG. 6 is a side-on and part-section view of a typical spectral purity filter SPF (not in accordance with an embodiment of the present invention). The spectral purity filter SPF depicted may be, for example, a more detailed representation of a spectral purity filter SPF described in relation to FIGS. 4 and 5.

The spectral purity filter SPF comprises of a silicon foundation structure 50. The silicon foundation structure comprises (e.g. is provided in a previous processing step) with a plurality of apertures 42 configured as discussed above to suppress radiation having a certain wavelength, for example by diffraction or the like. Silicon is chose as the foundation material since silicon may be easily worked with in a lithographic process or the like. The silicon foundation structure 50 (which may be referred to as a silicon grid or a silicon grating or the like) is provided with a molybdenum coating 54. The molybdenum coating 54 is provided to reflect infrared radiation that is incident on the spectral purity filter SPF, and thus reduce the heat load on, and temperature of, the spectral purity filter SPF as a whole. In the Figure, the molybdenum coating 54 is shown as being located on a single face of the silicon support structure 50, for instance the face that will face towards incident radiation. In other embodiments, the molybdenum coating may coat more regions or faces of the silicon foundation structure.

During use of the spectral purity filter SPF, even with the presence of the reflective molybdenum coating 54, the spectral purity filter SPF may be subjected to a high heat load (e.g. in excess of 800° C.) and for a prolonged period of time. It has been found that such a spectral purity filter SPF has an inadequate and insufficient lifetime above 800° C. This is due to a reaction between the reflective molybdenum coating 54 and the underlying silicon foundation structure 50, which results in eventual delamination of the molybdenum coating 54. Spectral purity filters are often used in the presence of hydrogen. This is because hydrogen is often used as a debris suppressant, for example to suppress the passage of debris between different parts of a lithographic apparatus or to prevent debris from being incident upon the spectral purity filter. In the presence of hydrogen, however, delamination and thus degradation of the silicon foundation structure 50 has been found to be accelerated, further reducing the lifetime of the spectral purity filter SPF.

It is desirable to provide a spectral purity filter which is more resilient to the temperatures that such a filter might be subjected to during typical use of the filter, and for example in the presence of hydrogen.

In accordance with an embodiment of the present invention, material solutions have been found to the challenges discussed above. In accordance with an aspect of the invention, there is provided a spectral purity filter which comprises of a body of material through which a plurality of apertures extend. As with a typical existing spectral purity filter, the apertures are arranged to suppress radiation having a first wavelength (e.g. by diffraction or the like) and to allow at least a portion of radiation having a second, shorter, wavelength to be transmitted through the apertures. For example, the first wavelength of radiation may be or comprise infrared radiation, for example, radiation having a wavelength of 9-12 µm, for example about 9.4 µm or about 10.6 µm. The second wavelength of radiation may be, for example, radiation having a wavelength in the EUV part of the electromagnetic spectrum, for example radiation having a wavelength in the range of 5-20 nm, for example 13-14 nm or 6-7 nm, for instance 6.6-6.9 nm. The body of material may be formed from a molybdenum-rhenium alloy, or a tungsten-rhenium alloy, or a tungsten-molybdenum-rhenium alloy. Such alloys are more ductile and have a higher re-crystallization temperature than either pure molybdenum or pure tungsten, meaning that a spectral purity filter formed from such alloys is more durable and has a longer lifetime than a typical spectral purity filter as discussed above. An alternative alloy might be a tungsten-molybdenum alloy, which still performs better than a known metal coated, and silicon based spectral purity filter. Furthermore, such alloys are not known to be reactive with hydrogen, allowing a spectral purity filter formed from such alloys to be used in a hydrogen rich atmosphere with little or no risk of degradation resulting from the presence of hydrogen.

According to an aspect of the present invention, there is provided a spectral purity filter comprising a body of material through which a plurality of apertures extend. As with the previously described aspect of the invention, the apertures are arranged to suppress radiation having a first wavelength (e.g. by diffraction or the like) and to allow at least a portion of radiation having a second, shorter wavelength to be transmitted through the apertures. For example, the first wavelength of radiation may be or comprise infrared radiation, for example, radiation having a wavelength of 9-12 µm, for example about 9.4 µm or about 10.6 µm. The second wavelength of radiation may be, for example, radiation having a wavelength in the EUV part of the electromagnetic spectrum, for example radiation having a wavelength in the range of 5-20 nm, for example 13-14 nm or 6-7 nm, for instance 6.6-6.9 nm. In this aspect of the invention, the body of material is formed from molybdenum, or from tungsten. Furthermore, the body of material further comprises a plurality of nanoparticles for increasing a re-crystallization temperature of the body of material that forms the spectral purity filter, as a whole. By increasing the re-crystallization temperature, the body of material and thus the spectral purity filter as a whole is more resilient to prolonged use at high temperatures. Again, the use of molybdenum or tungsten results in a body of material, and thus a spectral purity filter, which is unreactive with respect to hydrogen, and this allows the spectral purity filter to be used in a hydrogen rich environment.

In both above-described aspects of the invention, the apertures of the spectral purity filter are described as being arranged to suppress radiation having a first wavelength and to allow at least a portion of radiation having a second, shorter wavelength to be transmitted through the apertures. Typical examples of such arrangements will not be discussed in detail herein, since such arrangements are known in the art and are not the subject of the present invention. The materials forming the spectral purity filter are described in more detail below, for example in relation to FIGS. 7-10. In FIG. 7-10, the Figures have not been drawn to any particular scale, and are given by way of example only.

Figure 7:
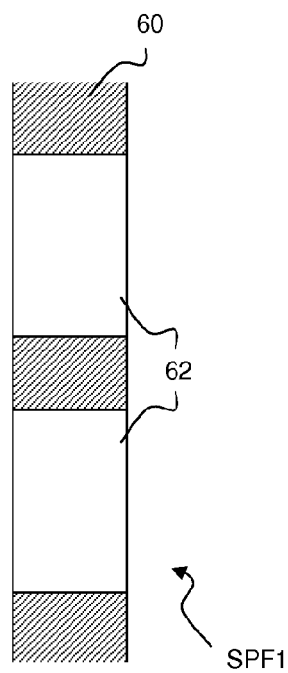
FIG. 7 schematically depicts a side-on and part-section view of a spectral purity filter in accordance with an embodiment of the present invention.

FIG. 7 schematically depicts a side-on and part-section view of a spectral purity filter SPF1 in accordance with an embodiment of the present invention. The spectral purity filter SPF1 comprises (or is formed from) a body of material 60 through which a plurality of apertures 62 extend. The apertures may be provided using drilling or the like, or in any other manner. The apertures 62 are arranged to suppress radiation having a first wavelength (e.g. by diffraction or the like) and to allow at least a portion of radiation having a second, shorter wavelength to be transmitted through the apertures 62. The body of material 60 may be formed from a molybdenum-rhenium alloy. In another example, the body of material may comprise or be formed from a tungsten-rhenium alloy, or from a tungsten-molybdenum-rhenium. Either alloy is more ductile and has a higher re-crystallization temperature than pure molybdenum or pure tungsten, and can function for a longer period of time at a higher temperature than a typical (existing) silicon and molybdenum based spectral purity filter. In yet another example, the body of material may comprise or be formed from a tungsten-molybdenum alloy, which can also function for a longer period of time at a higher temperature than a typical (existing) silicon and molybdenum based spectral purity filter.

If the body of material 60 is formed from a molybdenum-rhenium alloy, the content of rhenium in the alloy, in atomic percentage, may be 0.1% to 49%. If the body of material is formed from a tungsten-rhenium alloy, the content of rhenium in the alloy, in atomic percentage, may be 0.1% to 27%. If the body of material 60 is formed from a tungsten-molybdenum-rhenium alloy, the content of rhenium in the alloy, in atomic percentage, may be 0.1% to 49%.

Figure 8:
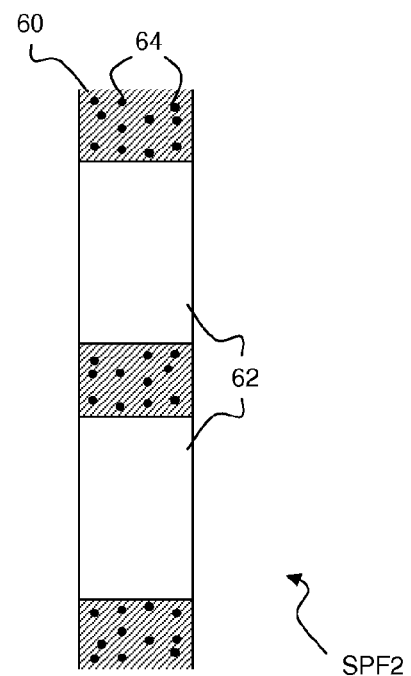
FIG. 8 schematically depicts a side-on and part-section view of a spectral purity filter in accordance with an embodiment of the present invention.

FIG. 8 schematically depicts another embodiment of a spectral purity filter SPF2. A molybdenum-rhenium alloy, or a tungsten-rhenium alloy, or a tungsten-molybdenum-rhenium alloy, a tungsten-molybdenum alloy forms the body of material 60. The spectral purity filter SPF2 comprises apertures 62 as previously discussed for suppression of radiation having a first wavelength, and for the transmission of radiation having a second, shorter wavelength. A difference between this embodiment of the spectral purity filter SPF2, and the spectral purity filter of FIG. 7 is that in the spectral purity filter of SPF2, the body of material 60 is further provided with a plurality of nanoparticles 64 for increasing a re-crystallization temperature of the body of material 60 as a whole and thus improving the temperature resilience of the spectral purity filter SPF2. The nanoparticles may comprise one or more of: $Al_2O_3$, $HfO_2$, $ZrO_2$, $Y_2O_3$, MgO, $La_2O_3$, $Ce_2O_3$, SrO, HfC. The nanoparticles 64 may, in an embodiment, be distributed in the body of material 60 in the form of one or more layers. For instance, in the formation of the spectral purity filter SPF2 an amount of an alloy may be deposited, followed by a layer of nanoparticles, followed by an amount of alloy, and so on until the body of material and spectral purity filter is formed. The provision of nanoparticles in the form of layers may be easier to implement than an alternative distribution, for example where the nanoparticles are uniformly distributed throughout the body of material.

In other embodiments of a spectral purity filter (not shown), nanoparticles may be provided (for example, in the form of one or more layers) in the body of material comprising substantially pure tungsten or pure molybdenum or an alloy of tungsten and molybdenum (i.e. there being no presence of rhenium). The lack of rhenium may mean that the body of material and the spectral purity filter as a whole is not as ductile as a spectral purity filter comprising a molybdenum-rhenium alloy or a tungsten-rhenium alloy. However, the presence of the nanoparticles will still increase the re-crystallization temperature of the spectral purity. By increasing the re-crystallization temperature, the body of material and thus the spectral purity filter as a whole may be more resilient to prolonged use at high temperatures in comparison with a typical silicon and molybdenum based spectral purity filter, as discussed above.

Figure 9:
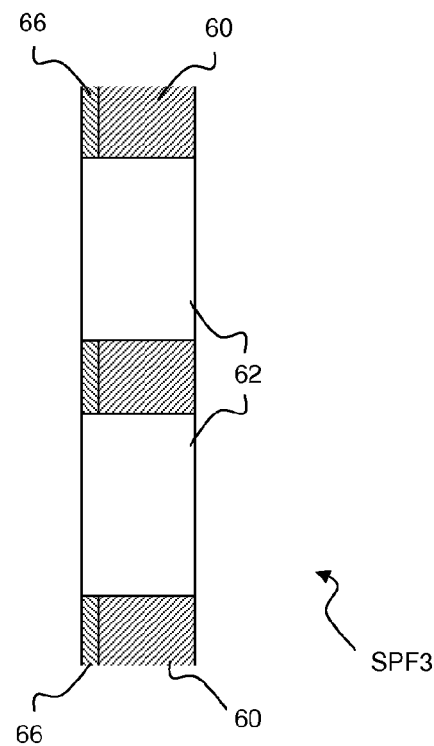
FIG. 9 schematically depicts a side-on and part-section view of a spectral purity filter in accordance with an embodiment of the present invention.

The function of the spectral purity filter is to substantially suppress radiation having a first wavelength, for example infrared radiation, and to allow (through the apertures or through the body of material forming the spectral purity filter) the transmission or passage of radiation having a second, shorter wavelength. Suppression of the radiation having the first wavelength may be via diffraction of radiation at the opening of the apertures and within the apertures, and/or from reflection of that radiation from the spectral purity filter itself. Pure tungsten and molybdenum are known, for example, to have a certain reflectivity with respect to infrared radiation (for example, 10.6 μm radiation). However, tungsten-rhenium alloys, and molybdenum-rhenium alloys, are known to have lower reflectivities than pure molybdenum or tungsten. It is desirable to be able to provide a spectral purity filter which is resilient to prolonged use at high temperatures, but which does not suffer from a reduction (or a substantial reduction) in reflectivity of radiation which the spectral purity filter is designed to suppress and/or reflect. FIG. 9 shows how a balance can be struck which results in these requirements being met.

FIG. 9 schematically depicts a spectral purity filter SPF3 according to a third embodiment of the present invention. The spectral purity filter SPF3 is in many ways similar to the spectral purity filter shown in and described with reference to FIG. 7. Referring back to FIG. 9, the spectral purity filter SPF3 comprises of a body of material 60 through which a plurality of apertures extend. The apertures 62 are again arranged to suppress radiation having a first wavelength, and to allow at least a portion of radiation having a second, shorter wavelength to be transmitted through the apertures. The body of material 60 is formed from a molybdenum-rhenium alloy, or a tungsten-rhenium alloy, or a tungsten-molybdenum-rhenium alloy. As discussed above, such alloys have a reduced reflectivity with respect to, for example, infrared radiation at 10.6 μm than pure tungsten or pure molybdenum.

To overcome this challenge, a face of the body of material 60 through which the apertures 62 extend comprises of, or is provided with, a region or layer that is formed from substantially pure molybdenum or tungsten 66, or from an alloy of molybdenum and tungsten. In other embodiments, a separate layer may not be provided on a face of the body of material. For instance, the body of material can be formed in such a way that the body of material comprises an alloy for a part of body and then, in a region approaching and including a face of the body of material, the processing or manufacture of the body of material may be such that the material is no longer an alloy but is pure molybdenum or tungsten, or an alloy of molybdenum and tungsten not containing rhenium.

In use, the face provided with the layer (or comprising the region of) substantially pure molybdenum or tungsten, or an alloy thereof, will face towards incident radiation comprising the first wavelength and/or second wavelength of radiation in order to, for example, reflect the first wavelength of radiation.

FIG. 9 is shown by way of example only. For example, in another embodiment (not shown) such a pure molybdenum or tungsten layer or region may be provided on, or constitute, a face of a body of material comprising of substantially pure molybdenum or tungsten or an alloy thereof (i.e. not an alloy containing rhenium), but with added nanoparticles. In another embodiment (not shown) such a pure molybdenum or tungsten (or alloy thereof) layer or region may be provided on, or constitute, a face of a body of material formed from a molybdenum-rhenium alloy with added nanoparticles, or from a tungsten-rhenium alloy with nanoparticles, or from a tungsten-molybdenum-rhenium alloy with nanoparticles as discussed above.

The reflective layer or region shown in and described with reference to FIG. 9 is sometimes referred to as a capping region or layer.

Figure 10:
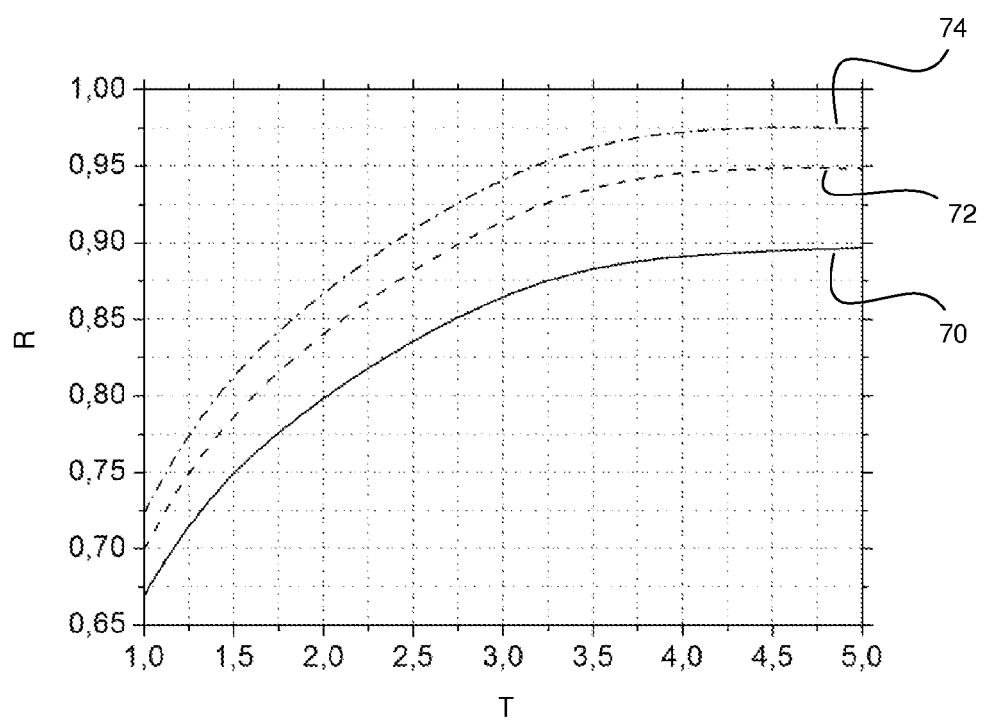
FIG. 10 is a graph depicting a reflection (at 10.6 µm) of the spectral purity filter of embodiments of the present invention, as a function of thickness of those spectral purity filters.

FIG. 10 is a graph showing the fractional reflectivity R of exemplary spectral purity filters as a function of thickness T of each spectral purity filter. Reflectivity is measured at 10.6 μm.

A first series 70 (represented by the solid line) is representative of the reflectivity of a spectral purity filter formed from a body of material comprising of a tungsten-rhenium alloy, and with no pure tungsten reflective layer or region on the face (i.e. no capping layer).

A second series 72 (indicated by the dash line) is representative of the reflectivity of a spectral purity filter formed from a body of material comprising a tungsten-rhenium alloy, and additionally provided with a pure layer or region of tungsten on the face which is 100 nm thick. It can be seen that the reflectivity has increased in comparison with the situation where no such pure tungsten reflective layer was present (i.e. as seen in first series 70).

To demonstrate the trend, a third series 74 (indicated by the dot/dash line) is representative of a spectral purity filter formed from pure tungsten (i.e. no rhenium is present, and no capping layer is present). It can be seen that the reflectivity has increased. However, in this last example, where the spectral purity filter is formed from pure tungsten, the spectral purity filter will not be as thermally resilient as the spectral purity filters described above in embodiments of the present invention.

Embodiments of the invention has thus far has been described in relation to the use of materials such as: a molybdenum-rhenium alloy, or a tungsten-rhenium alloy; or a tungsten-molybdenum alloy; or a tungsten-molybdenum-rhenium alloy, or from tungsten and/or molybdenum containing nanoparticles. These materials may be desired for one or more of a number of reasons, for example one or more of: their relatively high melting point (see, for example, Table 1 below); existing knowledge of the use of these materials in manufacturing methods (although for other purposes); existing knowledge of the properties and behavior of these materials in (other) high temperature applications. However, embodiment of the invention are not limited to the use of these materials—i.e. other (e.g. refractory) materials may be used, as will be described in more detail below.

According to a more general aspect of the present invention, there is provided a spectral purity filter configured substantially as described above, through which a plurality of apertures extend. As with a typical existing spectral purity filter, apertures are arranged to suppress radiation having a first wavelength (e.g. by refraction of the radiation) and to allow at least a portion of radiation having a second, shorter, wavelength to be transmitted through the apertures. For example, the first wavelength of radiation may be or comprise infrared radiation, for example radiation having a wavelength of 9-12 µm, for example about 9.4 µm or about 10.6 µm. The second wavelength of radiation may be, for example, radiation having a wavelength in the EUV part of the electromagnetic spectrum, for example radiation having a wavelength in the range of 5-20 nm, for example 13-14 nm or 6-7 nm, for instance 6.6-6.9 nm. In general terms, the body of material forming the spectral purity filter may be described as a material having a bulk reflectance of substantially greater than or equal to 70% at the first wavelength of radiation or greater than or equal to 90% at the first wavelength of radiation (and less than or equal to 100% at the first wavelength of radiation). "Bulk reflectance" may be defined as normal-incidence reflectance of a substantially perfectly smooth continuous layer with a thickness substantially larger than the radiation wavelength. Furthermore, the material also has a melting point above 1,000° C., or above 1,400° C. There is no desired upper limit to the melting point, since a melting point that is as high as possible may be desired. An arbitrary limit to the melting point may be described as, for example, 10,000° C. Alternatively, an upper melting point limit of 3,500° C. may, together with a lower limit of 1,400° C., define a range which covers suitable materials (described below). A material having these properties is particularly useful as a spectral purity filter, and in particular as a spectral purity filter in an EUV lithographic apparatus where the temperatures may approach 1,000° C. or higher, and where it is desirable to reflect or suppress as much infrared radiation as possible, for example 10.6 µm radiation which may be generated, or used in the generation of, EUV radiation or the like.

Somewhat surprisingly, although materials having the above-mentioned reflectance and temperature properties have been used as coatings for spectral purity filters, there has been no disclosure, suggestion or teaching towards the formation of the body of a spectral purity filter (i.e. the majority of the spectral purity filter) from such a material. However, forming a spectral purity filter from a body of such material has advantages, for example less or no de-lamination that might be encountered when such materials are used as coatings.

Suitable materials which satisfy the above-mentioned criteria may be, for example one or more of, or a combination of: Cr, Fe, Ir, Mo, Nb, Ni, Os, Pt, Re, Rh, Ru, Ta, and W. Those materials may be used in isolation or combination, or may form an alloy. An alloy may be desirable to achieve certain material properties, for example increasing the ductility of the resultant body of material or the like. If an alloy is formed using these materials, other materials (not listed) may be used. Desirably, such other materials form a minority part by atomic weight of the alloy, so that the majority part formed by the above-mentioned materials dominates the structural properties of the material (for example temperature resistance or resilience, or reflectance and the like).

The above-mentioned materials all have a melting point which exceeds 1,400° C., and a bulk reflectance at 10.6 µm (and an infrared wavelength often associated with the generation of EUV radiation, as discussed above) which exceeds 90%. Table 1 below gives precise values for the melting point and bulk reflectance at 10.6 µm for each of these materials:

TABLE 1

| Material | Melting Point (° C.) | Bulk Reflectance (at 10.6 µm) |
| --- | --- | --- |
| Cr | 1857 | 93.95% |
| Fe | 1535 | 97.09% |
| Ir | 2443 | 97.18% |
| Mo | 2617 | 98.33% |
| Nb | 2468 | 97.75% |
| Ni | 1453 | 97.69% |
| Os | 3027 | 98.81% |
| Pt | 1772 | 97.00% |
| Re | 3180 | 98.28% |
| Rh | 1966 | 98.22% |
| Ru | 2250 | 97.64% |
| Ta | 2996 | 98.05% |
| W | 3422 | 97.91% |

A suitable range for the melting point of the material used to form the body of the spectral purity filter might be derived from the values in Table 1. The melting point range might be, for example, 1453° C. to 3422° C., inclusive. Alternatively or additionally, a suitable range for the bulk reflectance of the material at the first wavelength of radiation (e.g. at 10 nm) might be derived from the values in Table 1. The bulk reflectance of the material at the first wavelength of radiation (e.g. at 10 µm) might be in the range of, for example, 93.95% to 98.81% inclusive.

It may be desirable to us only a sub-set of the materials described above, i.e. a sub-set of: Cr, Fe, Ir, Mo, Nb, Ni, Os, Pt, Re, Rh, Ru, Ta, and W. For example, some of the materials in the sub-set might have too high an affinity for oxide, or too high a vapor pressure, or the like. A desirable sub-set not exhibiting these disadvantages may be, for example, Mo, W, Ta, Re, Ir, Nb, and Ru. A suitable range for the melting point of the sub-set of desirable materials used to form the body of the spectral purity filter might be derived from the values in Table 1. The melting point range might be, for example, greater than or equal to 2250° C., for instance in the range of 2250° C. to 3422° C., inclusive. Alternatively or additionally, a suitable range for the bulk reflectance of the material at the first wavelength of radiation (e.g. at 10 μm) might be derived from the values in Table 1. The bulk reflectance of the material at the first wavelength of radiation (e.g. at 10 μm) might be in the range of, for example, 97.18% to 98.81% inclusive.

The more generic description of the invention provided above may be further defined (and/or limited) by the addition of further features already described in relation to the more specific molybdenum and/or tungsten embodiments (and/or alloys thereof). For instance, in addition to the more general definition given above, the material or materials used to form the body of the spectral purity filter may further comprise a plurality of nanoparticles for increasing a re-crystallization temperature of the material (and thus the spectral purity filter) as a whole. For instance, the nanoparticles may comprise of one or more of: $HfO_2$, $ZrO_2$, $Y_2O_3$, MgO, $La_2O_3$, $Ce_2O_3$, SrO, and HfC. The nanoparticles may be distributed in layers within the body of material. The provision of nanoparticles in the form of layers may be easier to implement than an alternative distribution, for example where the nanoparticles are uniformly distributed throughout the body of material.

As already discussed in relation to the molybdenum and tungsten embodiments above, an alloy of one or more materials may result in a reflectance (for example, at 10.6 μm) being lower than a reflectance for the materials in pure, independent form. Thus, for the more general embodiments, a face of the body of material through which the apertures extend may comprise of, or be provided with, a region or layer that is formed from substantially pure Cr, Fe, Ir, Mo, Nb, Ni, Os, Pt, Re, Rh, Ru, Ta, and W. The region or layer may be added to an existing body of material, or the region or layer may be integrally formed with that body of material. For instance, in one embodiment a large portion of the body of material may be formed from an alloy of a combination of the materials, and, by appropriate processing, a face may be integrally formed (e.g. grown or deposited) from only a pure material. Integral formation of the face may lead to a more robust construction. The face will, in use, face toward incident radiation comprising the first wavelength and/or the second wavelength of radiation to ensure that the first wavelength of radiation is properly suppressed (e.g. by reflection).

In any of the more general embodiments described above, one or more silicides of the materials Cr, Fe, Ir, Mo, Nb, Ni, Os, Pt, Re, Rh, Ru, Ta, and W may be used instead of, or in combination with those materials in pure form. In comparison with the materials in pure form, silicides of those materials may have a lower bulk reflectance for a first wavelength of radiation, for example an infrared wavelength such as for example 10.6 um (e.g. greater than or equal to 70%). In comparison with the materials in pure form, silicides of those materials may have a lower melting point e.g. 1000° C. or greater, 1100° C. or greater, 1200° C. or greater or 1300° C. or greater, or 1400° C. or greater. At the same time, however, such silicides may have a more stable re-crystallization temperature, and/or and improved resistance to hydrogen, which may be useful in an environment where the spectral purity filter is repeatedly exposed to high temperatures, or a hydrogen filled environment.

In some embodiments, the heat load on the spectral purity filter will be such that re-crystallization may still prevalent, possibly even if the re-crystallisation temperature has been increased in accordance with features of the present invention. A problem is how to suppress re-crystallization in or of the spectral purity filter.

The deposited (e.g. metal) layer (i.e. the body of material) from which the spectral purity filter is manufactured generally has a columnar grain microstructure as a result of the deposition process, for example a sputter deposition process. This means that the layer consists mostly of grains that have a much larger vertical size than lateral size, the grains extending in a columnar manner from the bottom to the top of the deposited layer.

Most re-crystallization suppression mechanisms rely on the pinning of grain boundaries (e.g. through segregation of solutes or impurities or through precipitation of second-phase particles). A spectral purity filter with a columnar grain microstructure is not optimally suited for such suppression mechanisms. This is because both the grains and the spectral purity filter walls (i.e. that define apertures) have a high aspect ratio shape with the long axis normal to the layer surface. As a result, the grain boundary content of the spectral purity filter structure is relatively low, and re-crystallization is not satisfactorily suppressed.

According to the present invention, the body of material used to form the spectral purity filter has a grain structure: that is substantially equiaxed (i.e. having grains with an aspect ratio of the order of 1); and/or in which an average grain size is smaller than a width of a wall defining an aperture, or smaller than a shortest distance between two adjacent apertures; and/or in which an average grain size or diameter is less than 500 nm, or less than 200 nm. At the same lateral grain size, a spectral purity filter with equiaxed grain structure will contain a substantially higher fraction of grain boundaries than a spectral purity filter with a columnar grain microstructure. A spectral purity filter according to the present invention will therefore be more resistant to re-crystallization.

Figure 11A:
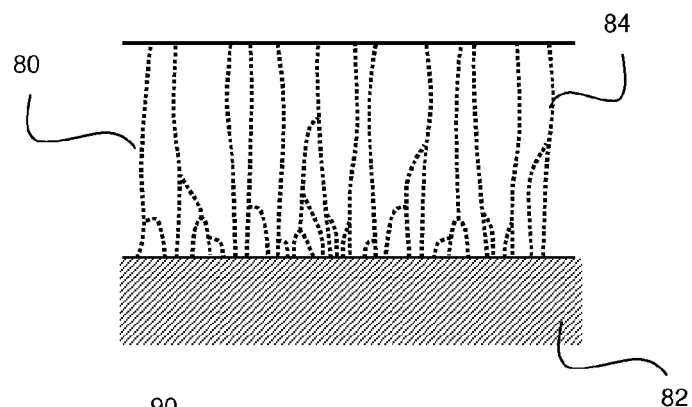
FIGS. 11a and 11b schematically depict a columnar grain structure of a spectral purity filter during manufacture, and when manufactured, respectively.

FIG. 11a shows a metal layer 80 (i.e. a body of material) deposited on a substrate 82 using sputter deposition. A columnar grain microstructure 84 is present.

Figure 11B:
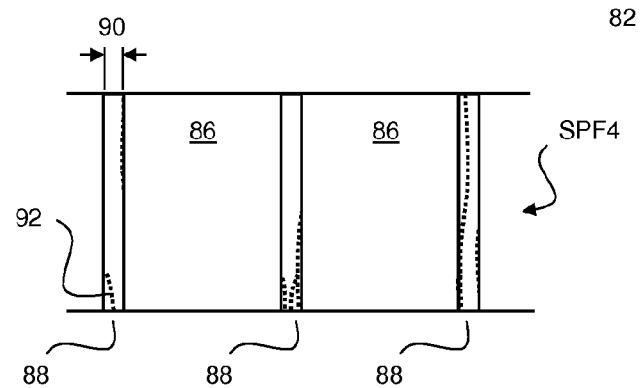

FIG. 11b shows a spectral purity filter SPF4 that has been formed in the layer of FIG. 11a. Referring to FIG. 11b, the spectral purity filter SPF4 has been formed by forming apertures 86 in the layer of FIG. 11a. Aperture walls 88 remain which correspond to the material remaining after the apertures 86 have been provided. The aperture walls 88 have a width 90, which may also be the shortest distance between apertures 86. Due to the columnar grain structure of the layer in which the apertures 86 are formed, the walls 88 contain only few grain boundaries 92. As a result, re-crystallisation is not satisfactorily suppressed.

Figure 12A:
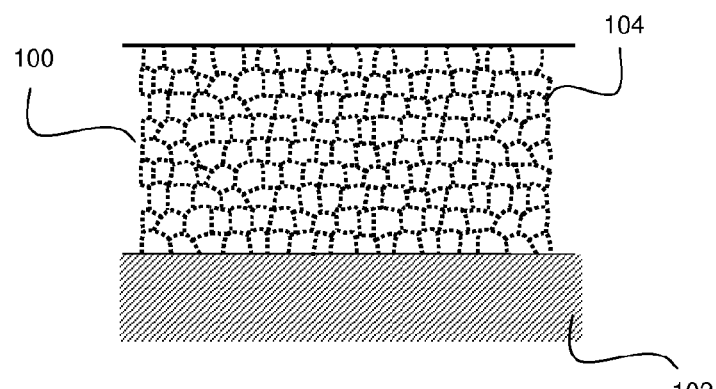
FIGS. 12a and 12b schematically depict a substantially equiaxial grain structure of a spectral purity filter during manufacture, and when manufactured, respectively, in accordance with an embodiment of the present invention.

According to an aspect of this invention, a layer may be deposited such that the grains have an aspect ratio of the order of 1 (i.e. are equiaxed). FIG. 12a shows a metal layer 100 (i.e. a body of material) that has been provided on a substrate 102. The metal layer 100 is shown as having a substantially equiaxed grain structure 104.

Figure 12B:
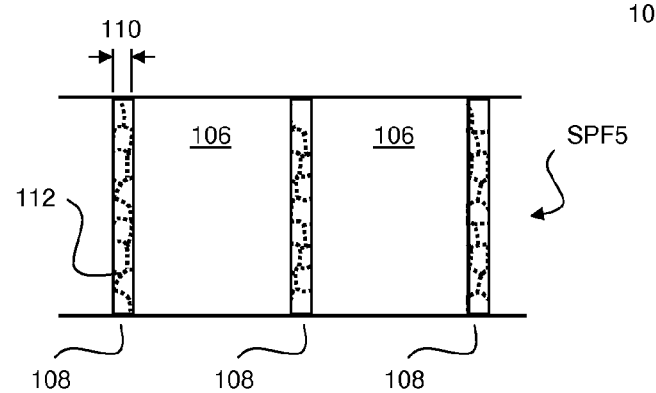

FIG. 12b shows a spectral purity filter SPF5 that has been formed in the layer of FIG. 12a. Referring to FIG. 12b, the spectral purity filter SPF5 has been formed by forming apertures 106 in the layer of FIG. 12a. Aperture walls 108 remain which correspond to the material remaining after the apertures 106 have been provided. The aperture walls 108 have a width 110, which may also be the shortest distance between apertures 106. Due to the equiaxed grain structure of the layer in which the apertures 106 are formed, the walls 108 contain significantly more grain boundaries 112 than the spectral purity filter of FIG. 11*b*. As a result, re-crystallisation is more satisfactorily suppressed.

In a preferred embodiment, the average grain size is smaller than the width of the walls of the spectral purity filter, thus ensuring or at least promoting the formation of grain boundaries in a wall. For example, the average grain size (e.g. a diameter) may be less than 500 nm, or more preferably, less than 200 nm.

Figure 13:
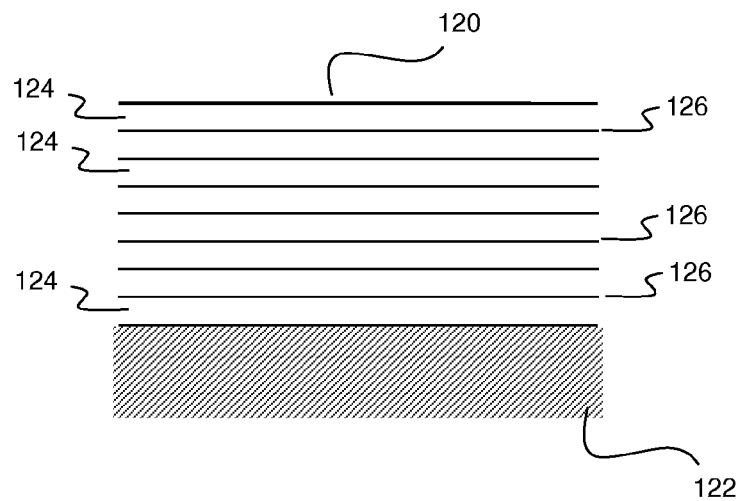
FIG. 13 schematically depicts a step in a method of manufacture of the spectral purity filter of FIGS. 12a and 12b.

In some embodiments, it may be preferred to promote or encourage the formation of a more equiaxial grain structure, or prevent the formation of a more columnar structure. FIG. 13 shows an example of a W—Ti/B multilayer 120 having a total thickness 135 nm total thickness. The multilayer has been provided on a substrate 122. The W-T±124 of the multilayer 120 is prevented from forming a columnar grain structure by repeated deposition of relatively thin B layers 126 (e.g. having a thickness of ~0.1 nm). A very fine, substantially equiaxed, grain structure with a grain size of the order of a few nanometers is achieved with a minor addition of only ~5% B.

The deposition or promotion of an equiaxed grain structure in the main body of material may be achieved by periodically interrupting a (e.g. sputter) deposition process in order to reset preferential crystal orientations and start the next deposition cycle without history effect of the previous cycle. This may be accomplished for example by the deposition of a thin layer of a second material, relative to the previous and/or subsequent deposition of a layer of material that forms the main body of material i.e. the body of material is divided into a plurality of relatively thick layers by a plurality of relatively thin layers of a second material. In any embodiment, the layer (i.e. body) of material having the equiaxed grain structure may be formed from any of the materials, or combinations of those materials discussed above in relation to other embodiments. In relation to this specific methodology, the second material may be for example, B, C, Si, or an oxide, nitride or carbide of one of the constituents of the metallic layer. The second material may also be one of the abovementioned nanoparticles ($Al_2O_3$ etc.). An advantage of the use of nanoparticles is that the nanoparticles may already be distributed homogeneously through the metallic layer (if such nanoparticles have been used, as described in more detail above). Alternatively, the crystal orientation may be reset by periodically carrying out a sputter etch, which disturbs the crystallinity of the surface and thus allows the deposition of a new layer with unrelated crystal orientation.

In use, non-uniformities or rapid fluctuations in the radiation incident on a spectral purity filter can lead to a non-uniform, fluctuating distribution of the heat load on the spectral purity filter. Heat transfer by conduction and convection is limited, and the non-uniform, fluctuating distribution of the heat load gives rise to large temperature variations of the spectral purity filter. Due to thermal expansion, these temperature variations result in mechanical stress, which can lead to bending or failure of the spectral purity filter. For instance, it has been found that rapid cooling or pulsed illumination of a spectral purity filter can rapidly cause damage to that filter. However, a spectral purity filter illuminated with the same but constant maximum power survived without damage for far longer. A problem is therefore how to reduce the non-uniformity and rate of change of the spectral purity filter temperature.

According to the present invention, the above mentioned problem may at least partially be overcome. According to an aspect of the invention, there is provided a spectral purity filter assembly, comprising: a spectral purity filter comprising a body of material, through which a plurality of apertures extend, the apertures being arranged to suppress radiation having a first wavelength and to allow at least a portion of radiation having a second wavelength to be transmitted through the apertures, the second wavelength of radiation being shorter than the first wavelength of radiation. The assembly further comprises an arrangement for, in use, increasing a temperature of at least a part of the spectral purity filter, the arrangement being separate from a source of the first and second wavelengths of radiation. Increasing the temperature of at least part of the spectral purity filter during use improves the uniformity and/or stability of the temperature.

General preferred or alternative features of the invention are now broadly described.

The arrangement may be configured to provide heat to the at least a part of the spectral purity filter in order to increase the temperature, and/or wherein the arrangement may be arranged to at least partially thermally insulate the spectral purity filter to, in use, increase the temperature.

The arrangement may comprise one or more mounts (e.g. ceramic mounts) for mounting the spectral purity filter and for at least partially thermally insulating the spectral purity filter (e.g. from surrounding structures or the like).

The arrangement may comprise a heat source. The heat source may be one or more of: one or more electrical heaters or conductors in contact with or forming a part of the spectral purity filter; and/or a radiation source arranged to direct radiation at the spectral purity filter, the radiation having a wavelength that is substantially absorbed by the spectral purity filter.

The spectral purity filter may comprise: a face that, in use, is configured to face toward incident radiation comprising the first wavelength and/or the second wavelength; and a backside, located on an opposite side of the spectral purity filter to the face, and wherein the heat source is configured to provide heat to the backside of the spectral purity filter. The face of the spectral purity filter may be substantially reflective with respect to the first wavelength of radiation, and wherein the backside is substantially absorbent with respect to the first wavelength of radiation.

According to an aspect of the invention, there is provided a method for increasing the temperature, in use, of a spectral purity filter, the method comprising: heating at least a part of the spectral purity filter using a heat source that is separate from a source of radiation that the spectral purity filter is designed to filter; and/or at least partially thermally isolating the spectral purity filter.

More specific examples and features of the invention are now described.

Figure 14:
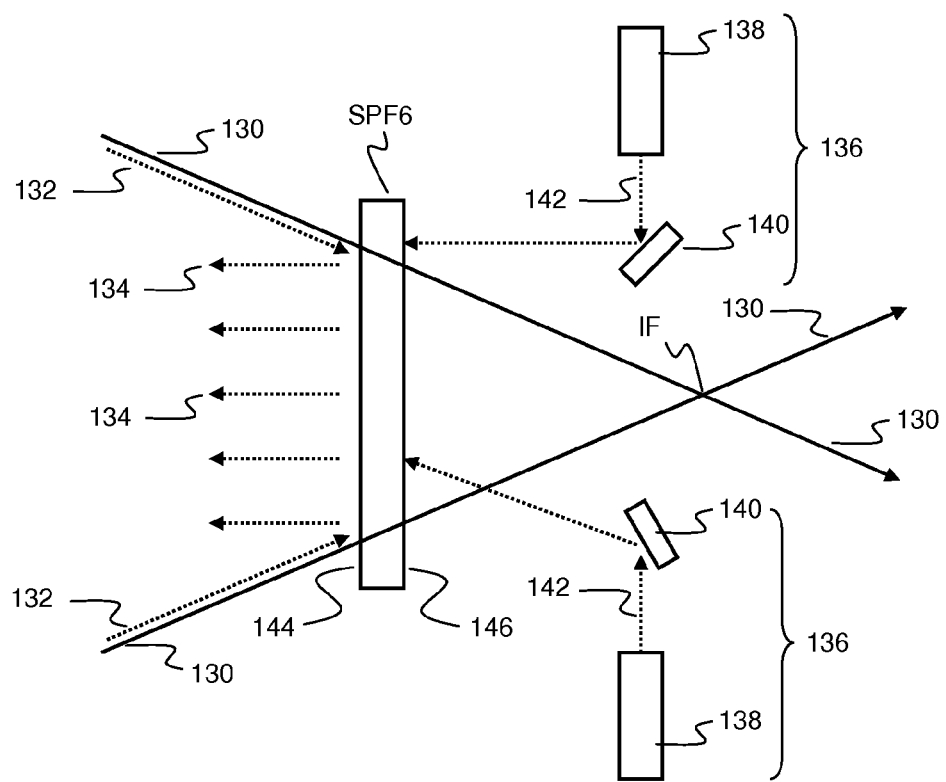
FIG. 14 schematically depicts spectral purity filter assembly, comprising a spectral purity filter and a heat source, in accordance with an embodiment of the present invention.

FIG. 14 shows a transmissive spectral purity filter SPF6. The spectral purity filter SPF6 may be for example a thin foil or a grid spectral purity filter as discussed in relations to other aspects and embodiment of the invention, above. The spectral purity filter SPF6 may be installed near a focus IF of a beam of radiation as shown in the Figure. The radiation beam comprises not only EUV radiation 130 but also out-of-band (e.g. infrared) radiation 132, part of which is substantially absorbed by the spectral purity filter SPF6 (and/or, in some embodiments, reflected by a face 134 of the spectral purity filter SPF6). A goal is to reduce fluctuations and non-uniformity in the heating of the spectral purity filter SPF6 due to absorption of the infrared (or other out-of-band) radiation 132.

In this embodiment, one or more heat source assemblies 136 are provided. Each heat source assembly 136 comprises a radiation source 138 (e.g. a laser or a hot filament) and, for example, optics or the like 140 for (e.g. controllably) directing radiation 142 generated by the source 138 onto one or more specific areas or regions of the spectral purity filter SPF6. The radiation source 138 preferably emits radiation at a wavelength that is substantially absorbed by the spectral purity filter SPF6. The radiation source may be positioned upstream or downstream from the spectral purity filter SPF6.

In one embodiment, a front side 144 of the spectral purity filter SPF6 (i.e. the side that faces the radiation to be filtered) is substantially reflective with respect to infrared radiation, while the backside 146 is absorbing with respect to infrared radiation (and hence, also emits infrared radiation). In this geometry the additional radiation 142 to improve the temperature uniformity is preferably provided from the absorbing backside 146, since this requires less power to achieve. Such a spectral purity filter SPF6 may be, for example, a metal coated Si grid. The reflectivity of the metal coated front side or face 144 will be higher than the reflectivity of the Si backside 146.

An alternative or additional embodiment (not shown) uses electrical heating. In this embodiment, a voltage is applied across (part of) the spectral purity filter, or a conductor located thereon, in order to heat the spectral purity filter SPF6 by resistive heating.

An alternative or additional embodiment (not shown), the spectral purity filter is mounted such that it is substantially thermally insulated from its environment, for example by using ceramic mounts. This will increase the temperature of the spectral purity filter compared to, for example, a metal (and thus conducting) support structure.

In one embodiment, the additional heat load (from the additional radiation source or electrical heating or the like) may be substantially uniform. Although this does not reduce the non-uniformity of the total heat load on the spectral purity filter SPF6, the temperature may be made significantly more uniform. Consider for example a spectral purity filter that is subjected to a non-uniform heat load (i.e. absorbed power) ranging from a minimum $P_{min}$=1 W/cm$^2$ at one position to a maximum $P_{max}$=4 W/cm$^2$ at another position. Assuming a spectral emissivity of 0.5 for all relevant wavelengths, this leads to equilibrium temperatures of $T_{min}$=1090 K and $T_{max}$=771 K, respectively. Hence, the temperature difference across the spectral purity filter is 319 K. When a uniform power load of 4 W/cm$^2$ is added, the total heat load changes to $P_{min}'$=5 W/cm$^2$, $P_{max}'$=8 W/cm$^2$. The corresponding equilibrium temperatures are $T_{min}'$=1296 K and $T_{max}'$=1152 K, and the temperature difference is 144 K. Thus, although the maximum temperature increases by about 200 K, the temperature non-uniformity across the filter decreases by 175 K.

In another embodiment, the additional heat load provided by the heat source may have a distribution that is at least partly complementary to the distribution of the heat load provided by the radiation that is to be filtered by the spectral purity filter (i.e. the original heat load). For example, the heat load in the radiation beam from an EUV source/collector module is typically highest in the centre of the beam (around the optical axis) and lower near the perimeter of the beam's cross section. In this case, it is preferable that the additional heat load provided to the spectral purity filter has an annular distribution, i.e. low in the centre and high at the outside of the spectral purity filter. Such a distribution may be realized for example using a circular filament that is properly shielded such that only an outer ring of the spectral purity filter is illuminated by the radiation generated by that filament. By including a complementary heat load, the total heat load, and thereby the equilibrium temperature, can be made more uniform without increasing the maximum temperature of the spectral purity filter.

In order to limit the power consumption, and also the heat load on other parts of the lithographic apparatus (or other apparatus in which the spectral purity filter assembly is used) other than the spectral purity filter, the additional radiation source(s) may be equipped with (or comprise, or be used in conjunction with) reflective or transmissive collection and projection optics, such that a significant fraction of the power generated by these radiation sources is delivered to the spectral purity filter (and not to the surroundings). Circular and ring-shaped apertures in this projection optics, or active control of the direction of propagation of a beam of radiation, may be used to tune the spatial intensity profile of the power delivered to the spectral purity filter.

In a further embodiment the additional heat load may be substantially constant in time. Similar to a uniform heat distribution, this will lead to a higher average temperature, but will also result in a smaller amplitude of the temperature fluctuations.

In yet another embodiment the additional heat load may be varied in time in a manner at least partly complementary to the fluctuations in the original heat load, for example due to pulsed or burst operation of a radiation source responsible for that original heat load. By using a large additional heating power when the radiation source is 'off' and a small additional heating power when the source is 'on' the heating and cooling rates can be reduced.

An all metal grid spectral purity filter is currently being considered, as discussed above. The spectral purity filter may be made solely, or mainly, from tungsten. This material has the advantage that it can withstand very high temperatures. However, at low temperatures tungsten is brittle and can easily break. At higher temperatures tungsten becomes ductile. Therefore another embodiment of the invention is to use the additional heating to maintain the temperature of the spectral purity filter above the brittle to ductile transition temperature (200-500° C. for tungsten). Of course, the same principle applies generally to other materials, such as those refractory materials discussed above.

In a lithographic apparatus, the spectral purity filter may be used in any convenient location, but is usually located either at the source side or at the illuminator side of an intermediate focus. When the spectral purity filter is placed on the source side it is likely to become contaminated with Sn used in the source to generate EUV radiation. Large amounts of Sn contamination will decrease the EUV transmission of the SPF and is thus undesirable. Therefore it is another embodiment of the invention to use the additional heating to maintain a sufficiently high temperature to desorb (e.g. evaporate) Sn from the filter and maintain sufficient EUV transmission. The evaporation rate of Sn depends strongly on temperature, for example: at 700 C, the evaporation rate is 0.03 nm/min; at 800 C, the evaporation rate is 0.8 nm/min; at 900 C, the evaporation rate is 13.7 nm/min; at 1000 C, the evaporation rate is 147 nm/min; at 1100 C, the evaporation rate is 1.1 µm/min; and at 1200 C, the evaporation rate is 6.5 µm/min.

In a further embodiment, care is taken that the temperature at an outer edge or frame of the spectral purity filter does not rise above critical levels. For example, in the case of a tungsten grid spectral purity filter with a silicon frame at its edge, the temperature at the edge should remain low enough to avoid a silicidation reaction between the tungsten grid and the silicon substrate (estimated limit ~700-800° C.).

The additional radiation source(s) may be placed inside a vacuum system of the lithographic apparatus (or a module thereof) or the radiation source, or outside of such a vacuum system. If located outside, the radiative power will need to be transmitted through a window or the like in this vacuum system. Wavelengths and window material should be chosen such that the power is substantially transmitted by the window.

It is to be expected that the temperature variations on or of the spectral purity filter will not be constant in time. There will be transient effects at start-up or shut-down, or when the power settings of the main source (i.e. that used to generate EUV radiation) are changed. Furthermore optical properties of the spectral purity filter may change over its lifetime. In one example, reflectivity at one or more wavelengths may decrease, whereas absorption may increase. Therefore, it is desirable to have a monitoring and control system and an automatic adjustment of the additional heating of the spectral purity filter. As input parameters, this monitoring system may measure, for example, one or more of: the power level of the main source; the power of the incident radiation on the spectral purity filter (total power, EUV power or infrared power); the average temperature of the spectral purity filter; the spectral purity filter temperature at the centre or periphery, or a temperature difference between the centre and periphery; the power delivered by the additional heating source(s); the amount of Sn on the spectral purity filter; the amount of EUV transmission of the spectral purity filter. Temperature may be measured, for example, via the resistivity of the spectral purity filter, thermocouples, or via radiation (pyrometer). Since it will probably be difficult to make good physical contact with the very thin and fragile spectral purity filter, a measurement via radiation may be preferred. Alternatively, the radius of curvature of the spectral purity filter may be measured. When the spectral purity filter gets hot it may curve due to thermal expansion and the resulting stress. Radius of curvature can be easily measured by measuring the deflection of a reflected laser beam or the like, allowing the temperature, or change in temperature, to be determined. The one or more heat sources can be controlled to ensure that the spectral purity filter is heated to the required extent, and/or at the required location(s).

Preferably the additional heating and/or monitoring and/or control system(s) can run on a back-up battery system, so that in the event of for example a mains power failure the temperature of the spectral purity filter can be reduced slowly, in order to avoid rupture of the spectral purity filter.

Adjustment of the additional heating provided by the one or more heat sources may involve an adaptation of the power level of the additional heating, or for example a change in the beam shape or propagation direction of a projection system of the radiation generated by those source (e.g. by changing apertures or masks in the beam path, or my angling of mirrors or lenses).

In any of the above-mentioned spectral purity filters, the apertures extending there through can be formed through drilling or the like. However, using drilling it may be difficult to produce a sufficiently high aspect ratio geometry, which may be required in some spectral purity filters. Alternative and/or improved methods for manufacturing spectral purity filters may therefore be desired.

One such method may involve providing the material that will form the body of material of the spectral purity filter on a substrate. The material is then patterned by lithography (optical or imprint) and etching (e.g. anisotropic etching). Such a lithography and etching process may together be used to form the plurality of apertures in that body of material, those apertures later being used to suppress radiation having a first wavelength, and to allow at least a portion of radiation having a second, shorter wavelength to be transmitted there through. When the body of material is released from the substrate, the body of material will form the spectral purity filter.

In another manufacturing method, a mould (sometimes referred to as 'mold') may be formed for reception of a body of material that is to be used to form the body of the spectral purity filter. The mould may be formed in a substrate or the like, for example using lithography and/or etching, and will define the shape of the spectral purity filter. For example, the mould will be shaped to provide a plurality of apertures in the body of material that is provided in the mould. The apertures will be arranged to, in use, suppress radiation having a first wavelength, while at the same time allowing radiation having a second, shorter wavelength to be transmitted through the apertures. The mould is then provided with (e.g. at least partially filled with) the body of material, for example using chemical vapor deposition, atomic layer deposition or electroplating. The mould is then removed (e.g. by physical separation of the body of material and the mould, or by dissolution or vaporisation or the like of the mould) to leave the body of material, which then forms the spectral purity filter.

The spectral purity filters discussed above may be used in a wide variety of applications. For instance, the spectral purity filters may be used in a lithographic apparatus, such as those discussed above in relation to FIGS. 1-3). Alternatively or additionally, a spectral purity filter may be used in or form part of a radiation source or the like.

The spectral purity filters discussed above have been described as being formed from a body of material. That body of material may be a single continuous piece of material, for added thermal resilience (e.g. no added layers or other components). The body of material may be substantially planar, but could also have another shape, for example a curved shape. A spectral purity formed from a body of material as described above comprises a majority amount of that material—i.e. that material does not only form a layer or coating or the like, but forms the body of the spectral purity filter.

For the avoidance of doubt, a spectral purity filter is sometimes given the suffix 'grid' or 'grating' (i.e. is sometimes referred to as a spectral purity filter grating, or as a spectral purity filter grid). Alternatively or additionally, a spectral purity filter is sometimes referred to as a grid filter, or as a grating filter.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

Further embodiments may be provided by the following numbered clauses:

1. A spectral purity filter assembly, comprising:
a spectral purity filter comprising a body of material, through which a plurality of apertures extend, the apertures being arranged to suppress radiation having a first wavelength and to allow at least a portion of radiation having a second wavelength to be transmitted through the apertures, the second wavelength of radiation being shorter than the first wavelength of radiation; and
an arrangement for, in use, increasing a temperature of at least a part of the spectral purity filter, the arrangement being separate from a source of the first and second wavelengths of radiation.

2. The spectral purity filter of clause 1, wherein the arrangement is configured to provide heat to the at least a part of the spectral purity filter in order to increase the temperature, and/or wherein the arrangement is arranged to at least partially thermally insulate the spectral purity filter to, in use, increase the temperature.

3. The spectral purity filter of clause 1 or clause 2, wherein the arrangement comprises one or more mounts for mounting the spectral purity filter and for at least partially thermally insulating the spectral purity filter.

4. The spectral purity filter of any of clauses 1 to 3, wherein the arrangement comprises a heat source.

5. The spectral purity filter of clause 4, wherein the heat source is one or more of:
one or more electrical heaters or conductors in contact with or forming a part of the spectral purity filter; and/or
a radiation source arranged to direct radiation at the spectral purity filter, the radiation having a wavelength that is substantially absorbed by the spectral purity filter.

6. The spectral purity filter of any clause 4 or clause 5, wherein the spectral purity filter comprises:
a face that, in use, is configured to face toward incident radiation comprising the first wavelength and/or the second wavelength; and
a backside, located on an opposite side of the spectral purity filter to the face
and wherein
the heat source is configured to provide heat to the backside of the spectral purity filter.

7. The spectral purity filter of clause 6, wherein the face of the spectral purity filter is substantially reflective with respect to the first wavelength of radiation, and wherein the backside is substantially absorbent with respect to the first wavelength of radiation.

8. A method for increasing the temperature, in use, of a spectral purity filter, the method comprising:
heating at least a part of the spectral purity filter using a heat source that is separate from a source of radiation that the spectral purity filter is designed to filter; and/or
at least partially thermally isolating the spectral purity filter.

9. The method or spectral purity filter of any preceding clause, wherein the first wavelength of radiation has a wavelength that is in the infrared region of the electromagnetic spectrum, and/or the first wavelength is in the range of 9-12 μm.

10. The method or spectral purity filter of clause 9, wherein the first wavelength is about 9.4 μM.

11. The method or spectral purity filter of clause 9, wherein the first wavelength is about 10.6 μm.

12. The method or spectral purity filter of any preceding clause, wherein the second wavelength of radiation has a wavelength that is substantially equal to or shorter than radiation having a wavelength in the EUV part of the electromagnetic spectrum, and/or the second wavelength is in the range of 5-20 nm.

13. The method or spectral purity filter of clause 12, wherein the second wavelength is in the range of 13-14 nm.

14. The method or spectral purity filter of clause 12, wherein the second wavelength is in the range of 6-7 nm.

15. The method or spectral purity filter of clause 14, wherein the second wavelength is in the range of 6.6-6.9 nm.

16. A lithographic apparatus, or a radiation source, having the spectral purity filter, or spectral purity filter assembly of any of clauses 1 to 7.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

What is claimed is:

1. A spectral purity filter for use with an extreme ultraviolet (EUV) light source, comprising:
a body of material, through which a plurality of through-holes extend, the through-holes being arranged to suppress radiation having a first wavelength and to allow at least a portion of EUV radiation having a second wavelength to be transmitted through the through-holes, the second wavelength of EUV radiation being shorter than the first wavelength of radiation and wherein the body is thick relative to the radius of the through-holes;
the body of material comprising a material having a bulk reflectance of substantially greater than or equal to 70% at the first wavelength of radiation, and a melting point above 1000° C. and wherein the material comprises an alloy of one or more of: Cr, Fe, Ir, Mo, Nb, Ni, Os, Pt, Re, Rh, Ru, Ta, and W, or a silicide thereof.

2. The spectral purity filter of claim 1, wherein the alloy comprises a majority amount by atomic weight of one or more of, or a combination of one or more of: Cr, Fe, Ir, Mo, Nb, Ni, Os, Pt, Re, Rh, Ru, Ta, and W, or a silicide thereof.

* * * * *